United States Patent
Onishi

(10) Patent No.: US 11,146,081 B2
(45) Date of Patent: Oct. 12, 2021

(54) CIRCUIT DEVICE, CONTROL DEVICE, POWER RECEIVING DEVICE, AND ELECTRONIC DEVICE

(71) Applicant: SEIKO EPSON CORPORATION, Tokyo (JP)

(72) Inventor: Kota Onishi, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 244 days.

(21) Appl. No.: 16/367,624

(22) Filed: Mar. 28, 2019

(65) Prior Publication Data
US 2019/0302190 A1   Oct. 3, 2019

(30) Foreign Application Priority Data
Mar. 29, 2018 (JP) .............................. JP2018-064295

(51) Int. Cl.
*H02J 7/00* (2006.01)
*G01R 31/3835* (2019.01)
(Continued)

(52) U.S. Cl.
CPC ........ *H02J 7/0029* (2013.01); *G01R 31/3835* (2019.01); *H01M 10/425* (2013.01);
(Continued)

(58) Field of Classification Search
CPC .. H02J 7/0029; H02J 7/00306; H02J 7/00304; H02J 50/10; H02J 7/025;
(Continued)

(56) References Cited

U.S. PATENT DOCUMENTS 5,563,496 A * 10/1996 McClure ................. H02J 7/022
  320/128
5,583,871 A * 12/1996 Simmonds .......... H02J 7/00047
  320/151
(Continued)

FOREIGN PATENT DOCUMENTS

JP  3080655 B2 * 8/2000 ............... G06F 1/26
JP  3945837 B2 * 7/2007 .............. H02J 7/008
(Continued)

*Primary Examiner* — Helen Rossoshek
(74) *Attorney, Agent, or Firm* — Oliff PLC

(57) ABSTRACT

Provided are a circuit device, a control device, a power receiving device, an electronic device, and the like that realize measurement of a remaining battery amount and excessive discharge detection with low power consumption, and can reduce power consumption from a battery. The circuit device includes a measurement circuit that measures a battery voltage, an interface circuit that outputs battery voltage information to a processing device, and a control circuit. The measurement circuit has a counter, a resistance circuit that divides the battery voltage by a voltage division ratio set by a count value of the counter, and a comparator that compares an output voltage of the resistance circuit with a reference voltage. When power supply to the processing device is off, the counter sets the count value to a fixed value, and the control circuit performs battery protection control processing based on the comparison result of the comparator.

12 Claims, 9 Drawing Sheets

(51) Int. Cl.
  *H01M 10/42* (2006.01)
  *H01M 10/44* (2006.01)
  *H02J 50/10* (2016.01)
  *H03K 5/24* (2006.01)
  *H02J 7/02* (2016.01)

(52) U.S. Cl.
  CPC ............ *H01M 10/44* (2013.01); *H02J 7/025* (2013.01); *H02J 50/10* (2016.02); *H03K 5/24* (2013.01); *H01M 2010/4271* (2013.01); *H01M 2010/4278* (2013.01); *H02J 7/00306* (2020.01)

(58) Field of Classification Search
  CPC ............ H02J 7/0047; G01R 19/16542; G01R 31/3835; H01M 10/48; H01M 10/425; H01M 10/44; H01M 2010/4271; H01M 2010/4278; H03K 5/24; Y02E 60/10
  See application file for complete search history.

(56) References Cited

U.S. PATENT DOCUMENTS

| | | | | |
|---|---|---|---|---|
| 5,818,201 A * | 10/1998 | Stockstad | ............. | H02J 7/0016 320/119 |
| 6,320,275 B1 * | 11/2001 | Okamoto | ................ | B60L 3/04 307/10.1 |
| 6,340,889 B1 * | 1/2002 | Sakurai | ............. | G01R 31/3835 324/433 |
| 6,516,153 B2 * | 2/2003 | Honda | ................. | H05B 41/325 315/241 P |
| 6,897,635 B2 * | 5/2005 | Ozawa | ................ | H02J 7/0047 320/127 |
| 6,974,437 B2 * | 12/2005 | Lebel | ....................... | G06F 8/60 604/65 |
| 7,319,380 B2 * | 1/2008 | Schulze | ............... | B60C 23/0408 340/442 |
| 7,471,091 B2 * | 12/2008 | Suzuki | ............... | H01M 10/345 324/427 |
| 7,495,416 B2 * | 2/2009 | Sato | ...................... | H02J 7/0031 320/134 |
| 7,974,797 B2 * | 7/2011 | Shoji | ................... | G01R 31/396 702/63 |
| 8,102,687 B2 * | 1/2012 | Takasu | ................ | H02M 3/1582 363/132 |
| 8,138,726 B2 * | 3/2012 | Partin | ................... | H02J 7/0071 320/160 |
| 8,200,444 B2 * | 6/2012 | Vaingast | ............ | G01R 31/3648 702/62 |
| 8,359,174 B2 * | 1/2013 | Nakashima | ........... | H02J 7/0047 702/63 |
| 8,547,676 B2 * | 10/2013 | Nagasawa | ................ | H02H 3/07 361/93.9 |
| 8,885,307 B2 * | 11/2014 | Kobayakawa | ........... | G01K 7/42 361/87 |
| 9,541,975 B2 * | 1/2017 | Ukai | ......................... | G06F 1/28 |
| 10,096,866 B2 * | 10/2018 | Nagato | .............. | G01R 31/3647 |
| 2007/0194791 A1 * | 8/2007 | Huang | ................. | G01R 31/389 324/430 |
| 2008/0111520 A1 | 5/2008 | Sasaki | | |
| 2008/0253053 A1 * | 10/2008 | Formenti | .................. | H02J 7/02 361/111 |
| 2009/0139781 A1 * | 6/2009 | Straubel | .................. | B60L 50/64 180/65.1 |
| 2010/0121511 A1 * | 5/2010 | Onnerud | ................ | B60L 58/15 701/22 |
| 2010/0129700 A1 | 5/2010 | Tanno | | |
| 2010/0289457 A1 * | 11/2010 | Onnerud | .............. | H02J 7/00711 320/162 |
| 2012/0091966 A1 * | 4/2012 | Mori | ..................... | H01M 10/44 320/134 |
| 2013/0138373 A1 * | 5/2013 | Lee | ......................... | G06F 19/00 702/65 |
| 2013/0295421 A1 * | 11/2013 | Teramoto | ................ | G06F 21/81 429/61 |
| 2013/0335095 A1 * | 12/2013 | Kiuchi | .................. | B60L 3/0046 324/426 |
| 2015/0032394 A1 * | 1/2015 | Kimura | ................ | G01R 31/367 702/63 |
| 2015/0177331 A1 * | 6/2015 | Nakayama | .......... | G01R 31/3828 702/63 |
| 2016/0303977 A1 * | 10/2016 | Kudo | .................... | H02J 7/0021 |
| 2018/0284194 A1 * | 10/2018 | Andersson | ........... | H02J 7/0047 |
| 2019/0025382 A1 * | 1/2019 | Yamada | ................ | G01R 31/371 |

FOREIGN PATENT DOCUMENTS

| | | |
|---|---|---|
| JP | 2008-125268 A | 5/2008 |
| JP | 4091010 B2 * | 5/2008 |
| JP | 2010-124640 A | 6/2010 |
| JP | 2013148463 A * | 8/2013 |

\* cited by examiner

CIRCUIT DEVICE, CONTROL DEVICE, POWER RECEIVING DEVICE, AND ELECTRONIC DEVICE

CROSS REFERENCE

This application claims benefit of Japanese Application JP 2018-064295, filed on Mar. 29, 2018. The disclosure of the prior application is hereby incorporated by reference herein in its entirety.

BACKGROUND

1. Technical Field

The present invention relates to a circuit device, a control device, a power receiving device, an electronic device, and the like.

2. Related Art

In recent years, contactless power transmission that utilizes electromagnetic induction and enables power transmission without contact of metal portions has been in the spotlight. An example application of this contactless power transmission is charging of an electronic device incorporating a secondary battery, such as a household appliance or a mobile terminal, for example. This sort of charging of an electronic device is not limited to contactless power transmission, and there are also systems in which an electronic device is connected to a charger through a terminal.

The secondary battery continually discharges due to supplying power to a circuit and due to natural discharge, and when the secondary battery is in an excessively discharged state, there is a risk that the characteristics of the secondary battery will worsen or that it will become impossible to charge the secondary battery. Therefore, in order to protect the secondary battery from excessive discharge, excessive discharge detection is performed by monitoring the voltage of the secondary battery.

As a current technique for performing excessive discharge detection, for example, there is a technique disclosed in JP-A-2010-124640. In JP-A-2010-124640, when the voltage of the secondary battery is detected to be an excessive discharge detection voltage or less, each part of an integrated circuit device enters a power down mode, and only an operation that detects whether or not the voltage of the secondary battery has reached a predetermined return voltage is performed. In this way, the power consumption of the secondary battery that supplies power to the integrated circuit device is suppressed.

SUMMARY

Among electronic devices powered by a secondary battery, there are electronic devices that measure a remaining battery amount of the secondary battery. For example, this sort of electronic device notifies a user by displaying the measured remaining battery amount. In order to measure the remaining battery amount, it is necessary to be able to measure the voltage of the secondary battery with a certain number of levels, and power consumption is ordinarily greater in this case than in the case of performing excessive discharge detection, in which the voltage of the secondary battery is compared with an excessive discharge detection voltage. The secondary battery is used in mobile devices, wearable devices, and the like, so it is desirable for the secondary battery to have low power consumption. Therefore, along with measurement of the remaining battery amount and implementing excessive discharge detection, it is desirable to reduce the power consumption of a measurement circuit.

One aspect of the invention relates to a circuit device including: a measurement circuit that measures a battery voltage; an interface circuit that outputs, to a processing device, battery voltage information that is information regarding the battery voltage measured by the measurement circuit; and a control circuit that performs battery protection control processing. The measurement circuit has a counter; a resistance circuit provided between a node where the battery voltage is input and a ground node, with a voltage division ratio set by a count value of the counter, and the resistance circuit outputting an output voltage obtained by dividing the battery voltage by the voltage division ratio; and a comparator that compares the output voltage from the resistance circuit with a reference voltage. When a power supply from a battery to the processing device is off, the counter sets the count value to a fixed value, and the control circuit performs the battery protection control processing based on a comparison result of the comparator.

Also, in one aspect of the invention, a configuration may be adopted in which the fixed value is a count value corresponding to an excessive discharge detection voltage for detecting excessive discharge of the battery.

Also, in one aspect of the invention, a configuration may be adopted in which when the power supply from the battery to the processing device is on, the counter stops a counting operation when a signal level of an output signal of the comparator transitions, and the interface circuit outputs the count value when the counting operation was stopped as the battery voltage information.

Also, in one aspect of the invention, a configuration may be adopted in which the control circuit, when the power supply from the battery to the processing device is off, determines whether or not the battery is in an excessively discharged state based on a comparison result of the comparator, and when the power supply from the battery to the processing device is on, determines whether or not the battery is in the excessively discharged state based on the count value when the counting operation was stopped.

Also, in one aspect of the invention, a configuration may be adopted in which the circuit device includes a register that stores the battery voltage information, and a level shifter that performs conversion from a signal level corresponding to a power supply voltage of the measurement circuit to a signal level corresponding to a power supply voltage of the register and the interface circuit. In this aspect of the invention, the counter, when performing the counting operation, sets an input signal level of the level shifter to a fixed signal level, the measurement circuit, when the counter has stopped the counting operation, writes the battery voltage information to the register through the level shifter, and the interface circuit outputs the battery voltage information written to the register to the processing device.

Also, in one aspect of the invention, a configuration may be adopted in which the measurement circuit intermittently performs an operation that measures the battery voltage.

Also, in one aspect of the invention, a configuration may be adopted in which the resistance circuit has a variable resistance circuit where the battery voltage is input to one end, and a resistance value is set by the count value; and a first resistor and a second resistor connected in series between the other end of the variable resistance circuit and a ground node. In this aspect of the invention, a voltage of a node between the first resistor and the second resistor is output to the comparator as the output voltage.

Also, another aspect of the invention relates to a control device that controls a power receiving device that receives electric power supplied from a power transmission device by contactless power transmission, the control device including: a charging-system circuit that receives electric power supplied from the power transmission device, and charges a charging subject based on the received electric power; and a discharging-system circuit that operates based on electric power from the charging subject, and supplies power to a processing device based on electric power from the charging subject. The discharging-system circuit includes: a measurement circuit that measures a battery voltage; an interface circuit that outputs, to the processing device, battery voltage information that is information regarding the battery voltage measured by the measurement circuit; and a discharging-system control circuit that performs battery protection control processing. The measurement circuit has a counter; a resistance circuit provided between a node where the battery voltage is input and a ground node, with a voltage division ratio set by a count value of the counter, and the resistance circuit outputting an output voltage obtained by dividing the battery voltage by the voltage division ratio; and a comparator that compares the output voltage from the resistance circuit with a reference voltage. When a power supply from a battery to the processing device is off, the counter sets the count value to a fixed value, and the discharging-system control circuit performs the battery protection control processing based on a comparison result of the comparator.

Also, still another aspect of the invention relates to a power receiving device including any control device described above.

Also, still another aspect of the invention relates to an electronic device including any circuit device described above.

Also, still another aspect of the invention relates to an electronic device including any control device described above.

BRIEF DESCRIPTION OF THE DRAWINGS

The invention will be described with reference to the accompanying drawings, wherein like numbers reference like elements.

FIG. 4 is a timing chart illustrating operation of the measurement circuit and the circuit device when power supply to a processing device is on.

DESCRIPTION OF EXEMPLARY EMBODIMENTS

The following describes exemplary embodiments of the invention. Note that the embodiments described below do not unreasonably limit the scope of the invention described in the claims, and not all of the configurations described in these embodiments are necessary to solve problems addressed by the invention.

1. Electronic Device, Circuit Device, and Measurement Circuit

Figure 1:
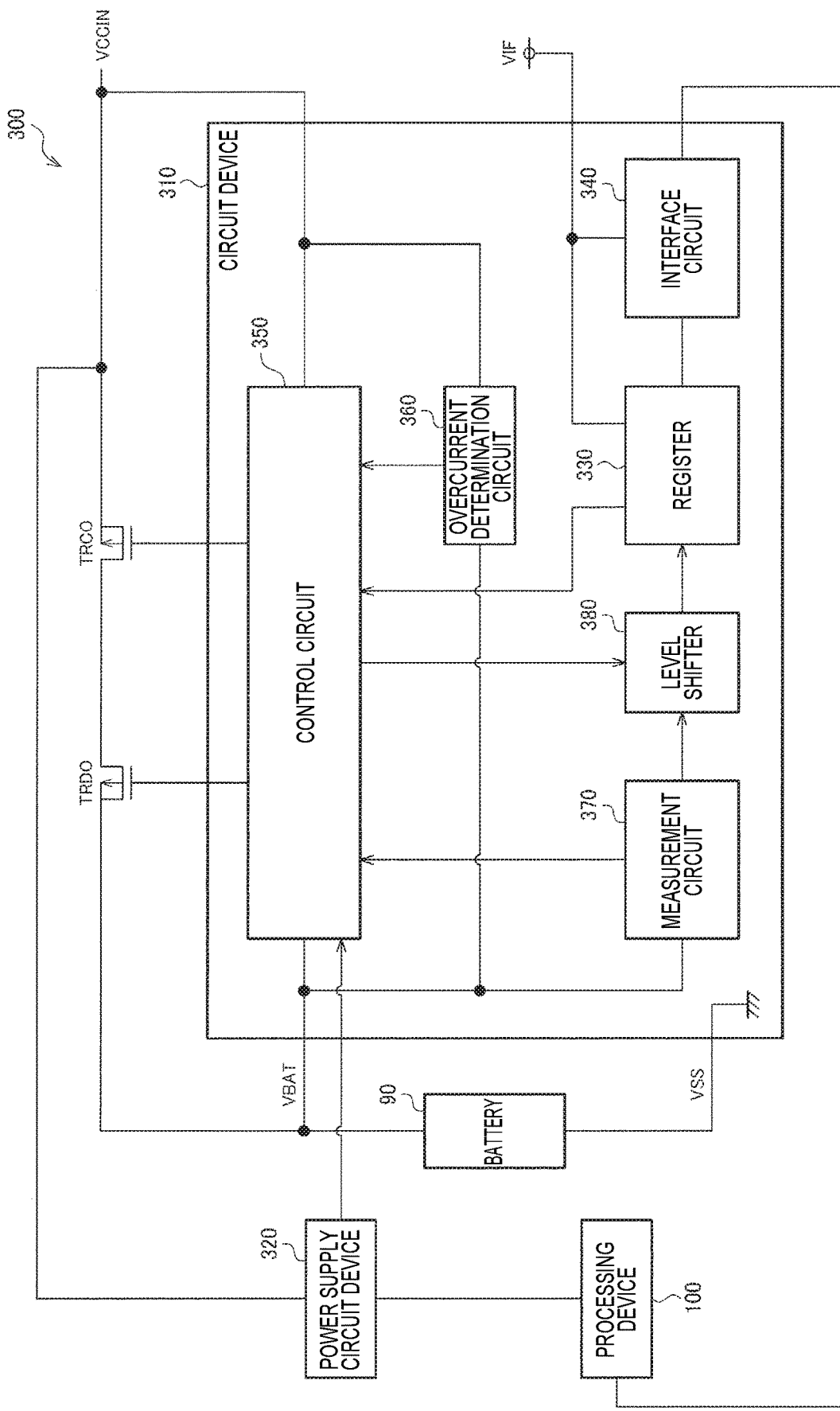
FIG. 1 shows a configuration example of a circuit device and an electronic device.

FIG. 1 shows a configuration example of a circuit device 310 and an electronic device 300. The electronic device 300 is a device that operates with the battery 90 as a power source and includes the circuit device 310, transistors TRDO and TRCO, a battery 90, a power supply circuit device 320, and a processing device 100. The circuit device 310 charges and protects the battery 90, and is, for example, an integrated circuit device. The power supply circuit device 320 supplies power from the battery 90 to each part of the electronic device 300, and is, for example, an integrated circuit device.

Note that in FIG. 1, each of the circuit device 310 and the power supply circuit device 320 is a circuit device, but this is not a limitation. The circuit device 310 and the power supply circuit device 320 can be configured as a single circuit device. For example, the invention is applicable to a control device 50 on a power receiving side of a contactless power transmission system 200 described later with reference to FIG. 8. In this case, a discharging-system control circuit 73 and a control circuit 151 in FIG. 8 correspond to a control circuit 350 in FIG. 1, a measurement circuit 78 in FIG. 8 corresponds to a measurement circuit 370 in FIG. 1, and an interface circuit 74 in FIG. 8 corresponds to an interface circuit 340 in FIG. 1. Also, the power supply circuit device 320 is included in the control device 50 as a power supply circuit 71 in FIG. 8.

The circuit device 310 includes the measurement circuit 370, a level shifter 380, a register 330, the interface circuit 340, the control circuit 350, and an overcurrent determination circuit 360.

The measurement circuit 370 measures a battery voltage VBAT, which is the terminal voltage of the battery 90. When the power supply circuit device 320 is supplying power to the processing device 100, the measurement circuit 370 performs A/D conversion of the battery voltage VBAT, and when the power supply circuit device 320 is not supplying power to the processing device 100, the measurement circuit 370 performs excessive discharge detection. Details of the measurement circuit 370 will be described later.

The interface circuit 340 outputs battery voltage information, which is information regarding the battery voltage VBAT measured by the measurement circuit 370, to the processing device 100. Specifically, digitally converted data of the analog battery voltage VBAT is written to the register 330 through the level shifter 380. This digitally converted data is battery voltage information. The processing device 100 accesses the register 330 through the interface circuit 340, and reads out the digitally converted data from the register 330.

Note that the interface circuit 340 can send and receive information between the processing device 100 and the circuit device 310. The sent and received information is, for example, data, a command, and the like. As the interface circuit 340, circuits of various interface systems can be adopted, and it is possible to adopt, for example, an interface circuit of an SPI (Serial Peripheral Interface) system or an I2C (Inter Integrated Circuit) system. Also, the interface circuit 340 may include an interrupt circuit that sends an interrupt signal to the processing device 100.

The control circuit 350 performs control processing related to charging and discharging of the battery 90. The control circuit 350 performs charging control and discharging control by controlling gates of the transistors TRCO and TRDO. The transistors TRCO and TRDO are provided in series between a node of a voltage VCCIN and a node of the battery voltage VBAT. The voltage VCCIN is a voltage supplied to charge the battery 90, and is supplied from a charger or a power receiving circuit in contactless power transmission, for example. The control circuit 350 switches on the transistors TRDO and TRCO when charging and discharging the battery 90.

Also, the control circuit 350 performs control processing related to protection of the battery 90. The control circuit 350 performs control processing to protect the battery 90 based on a measurement result from the measurement circuit 370. Specifically, when the power supply circuit device 320 is supplying power to the processing device 100, the control circuit 350 compares the battery voltage VBAT measured by the measurement circuit 370 with an excessive discharge detection voltage, and when the battery voltage VBAT is less than the excessive discharge detection voltage, discharging from the battery 90 is shut down. For example, a control signal instructing power supply stoppage and shutdown is transmitted to the power supply circuit device 320 through the interface circuit 340. When the power supply circuit device 320 is not supplying power to the processing device 100, the control circuit 350 shuts down discharging from the battery 90 when the excessive discharge detection result from the measurement circuit 370 indicates an excessively discharged state. Also, the control circuit 350 performs control processing to protect the battery 90 based on a determination result from the overcurrent determination circuit 360. Specifically, when the overcurrent determination circuit 360 detects that the charging current is an overcurrent, the control circuit 350 stops charging of the battery 90. When the overcurrent determination circuit 360 detects that the discharging current is an overcurrent, the control circuit 350 stops discharging of the power supply circuit device 320. Also, when the overcurrent determination circuit 360 detects a short circuit of the battery 90, the control circuit 350 stops charging to the battery 90 and shuts down discharging from the battery 90.

The control circuit 350 is configured with, for example, an analog charging circuit that controls the gates of the transistors TRCO and TRDO, and a logic circuit that controls the charging circuit and performs battery protection control processing.

The overcurrent determination circuit 360 determines charging overcurrent, discharging overcurrent, and a short circuit of the battery 90 based on the voltage VCCIN and the battery voltage VBAT. Specifically, when VCCIN>VBAT+$\Delta 1$, it is determined that there is a charging overcurrent. When VCCIN<VBAT−$\Delta 1$, it is determined that there is a discharging overcurrent. When VCCIN<VBAT−$\Delta 2$, it is determined that there is a short circuit of the battery 90. $\Delta 1$ and $\Delta 2$ are positive voltages, and $\Delta 2 > \Delta 1$. For example, the overcurrent determination circuit 360 is configured with a comparator that performs voltage comparison.

The battery 90 is, for example, a chargeable secondary battery, and is a lithium battery, a nickel battery, or the like, for example. The lithium battery is a lithium ion secondary battery, a lithium ion polymer secondary battery, or the like. The nickel battery is a nickel-hydrogen storage battery, a nickel-cadmium storage battery, or the like.

The processing device 100 is a power supply target to which electric power is supplied from the battery 90. The processing device 100 is, for example, an integrated circuit device or the like, and is, for example, a processor such as a DSP, a microprocessor, a microcontroller, or a CPU.

The power supply circuit device 320 has a power supply circuit that supplies power to the processing device 100 based on the battery voltage VBAT. The power supply circuit device 320 inputs information regarding whether the power supply from the power supply circuit to the processing device 100 is on or off to the control circuit 350. For example, the power supply circuit device 320 sends a control signal indicating whether the power supply is on or off to the control circuit 350 through a control signal input terminal of the circuit device 310.

Figure 2:
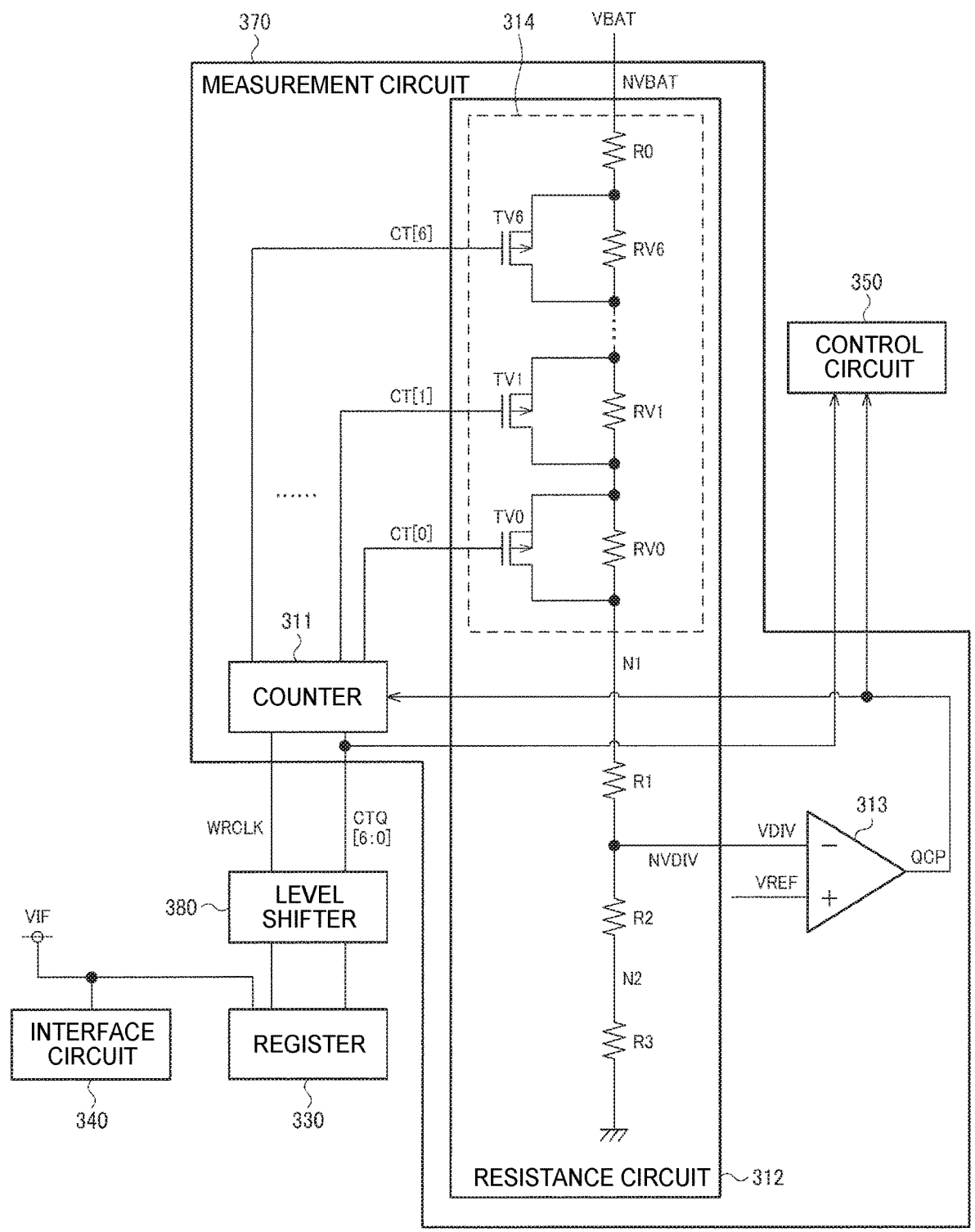
FIG. 2 shows a detailed configuration example of a measurement circuit.

FIG. 2 shows a detailed configuration example of the measurement circuit 370. The measurement circuit 370 includes a counter 311, a resistance circuit 312, and a comparator 313.

The resistance circuit 312 is provided between the node where the battery voltage VBAT is input and a ground node. In the resistance circuit 312, a voltage division ratio is set by a count value CT 6:0 of the counter 311, and an output voltage VDIV obtained by dividing the battery voltage VBAT by the division ratio is output. Note that in this embodiment, an example in which the counter 311 is a 7-bit counter is described, but the number of bits of the counter 311 is arbitrary.

The comparator 313 compares the output voltage VDIV from the resistance circuit 312 with a reference voltage VREF. Specifically, the output voltage VDIV is input to a negative terminal of the comparator 313, the reference voltage VREF is input to a positive terminal of the comparator 313, and the comparator 313 outputs the comparison result as an output signal QCP. Note that the negative terminal is a first input terminal in a broad sense, and the positive terminal is a second input terminal in a broad sense. The reference voltage VREF is supplied from an unshown voltage generating circuit.

When the counter 311 changes the count value CT 6:0, the voltage division ratio of the resistance circuit 312 changes, so the output voltage VDIV changes. By the comparator 313 comparing the output voltage VDIV with the reference voltage VREF, the battery voltage VBAT can be measured. As will be described later, this operation is performed when the power supply from the battery 90 to the processing device 100 is on.

On the other hand, when the power supply from the battery 90 to the processing device 100 is off, the counter 311 sets the count value CT 6:0 to a fixed value. The control circuit 350 performs battery protection control processing based on the comparison result of the comparator 313.

In the above embodiment, the circuit device 310 includes the measurement circuit 370, the interface circuit 340, and the control circuit 350. The measurement circuit 370 includes the counter circuit 311, the resistance circuit 312 that divides the battery voltage VBAT by the voltage division ratio set by the count value CT 6:0 of the counter 311, and the comparator 313 that compares the output voltage VDIV of the resistance circuit 312 with the reference voltage VREF. Also, when the power supply from the battery 90 to the processing device 100 is off, the counter 311 sets the count value CT 6:0 to a fixed value.

Due to the counter 311 setting the counter value CT 6:0 to a fixed value, the counter 311 stops the counting operation. Also, due to inputting the fixed count value CT 6:0 to the level shifter 320, the input signal level of the level shifter 320 does not change. Therefore, when power supply from the battery 90 to the processing device 100 is off, the counter 311 and the level shifter 38 at a subsequent stage do not operate, so power consumption from the battery 90 can be reduced.

Also, when the power supply from the battery 90 to the processing device 100 is off, the processing device 100 stops operation. Therefore, the processing device 100 does not acquire battery voltage information, so the measurement circuit 370 does not need to measure the battery 90. Therefore, it is possible to reduce power consumption by stopping the counting operation of the counter 311. On the other hand, from the viewpoint of protecting the battery 90, there are cases where it is desired to monitor the battery voltage with respect to a certain predetermined voltage. According to this embodiment, by setting the count value CT 6:0 to a fixed value, the comparator 313 compares the output voltage VDIV of the resistance circuit 312 at the fixed count value with the reference voltage VREF. In the protection of the battery 90, it is sufficient to monitor a certain voltage such as the excessive discharge detection voltage, so by adopting a configuration such as in this embodiment, it is possible to perform battery protection control processing. That is, according to this embodiment, by setting the count value CT 6:0 to a fixed value, battery protection can be realized, and also power consumption of the measurement circuit 370 can be reduced.

In this embodiment, the above fixed value is a count value corresponding to the excessive discharge detection voltage for detecting excessive discharge of the battery 90. That is, where the excessive discharge detection voltage is represented as VDET and the count value CT 6:0 is set to a fixed value, VDIV=VREF when VBAT=VDET. Here, the output signal QCP of the comparator 313 is the excessive discharge detection result.

By adopting such a configuration, when the power supply from the battery 90 to the processing device 100 is off, the measurement circuit 370 stops measurement of the battery voltage VBAT and performs excessive discharge detection. Thus it is possible to reduce the power consumption of the measurement circuit 370, and also to perform excessive discharge detection using the comparator 313. The control circuit 350 performs control to protect the battery 90 based on the result of this excessive discharge detection, and thus it is possible to protect the battery 90. As described above, when the power supply is on, the battery voltage VBAT is measured, and when the power supply is off, measurement of the battery voltage VBAT is stopped and excessive discharge detection is performed. Thus, it is possible to realize measurement of the remaining battery amount and excessive discharge detection, and it is also possible to reduce the power consumption of the measurement circuit 370 by stopping measurement of the remaining battery amount when measurement of the remaining battery amount is unnecessary.

As shown in FIG. 2, the resistance circuit 312 includes resistors R1 to R3, and a variable resistance circuit 314.

The battery voltage VBAT is input to one end of the variable resistance circuit 314. The resistance value of the variable resistance circuit 314 is controlled by the count value CT 6:0 of the counter 311. The resistor R1 (a first resistor) and the resistor R2 (a second resistor) are connected in series between the other end of the variable resistance circuit 314 and the ground node. The resistance circuit 312 outputs the voltage of a node NVDIV between the resistor R1 and the resistor R2 to the comparator as the output voltage VDIV.

Specifically, the resistor R1 is connected between a node N1 at the other end of the variable resistance circuit 314 and the node NVDIV, the resistor R2 is connected between the node NVDIV and a node N2, and a resistor R3 is connected between the node N2 and the ground node. The variable resistance circuit 314 includes a resistor R0, resistors RV0 to RB6, and transistors TV0 to TV6, which are connected in series between a node NVBAT where the battery voltage VBAT is input and the node N1. A transistor TVi is connected in parallel to a resistor RVi, and a bit signal CTi of the count value CT 6:0 is input to the gate of the transistor TVi. Here, i is an integer from 0 to 6, inclusive. The transistors TV0 to TV6 are P-type MOS transistors. When the bit signal CTi is a low level signal, the transistor TVi is switched on and both ends of the resistor RVi are short-circuited. That is, as the count value CT 6:0 decreases, the resistance value of the variable resistance circuit 314 decreases.

According to this embodiment, the output voltage VDIV of the resistance circuit 312 changes in accordance with the count value CT 6:0 of the counter 311. By the comparator 313 comparing the output voltage VDIV with the reference voltage VREF, the battery voltage VBAT can be measured. When the counter 311 performs the counting operation, the count value CT 6:0 when the comparison result of the comparator 313 changed indicates the battery voltage VBAT. Also, when the count value CT 6:0 is set to the fixed value described above, the comparison result of the comparator 313 changes when the battery voltage VBAT becomes smaller than the excessive discharge detection voltage.

Note that the configuration of the measurement circuit 370 is not limited to the configuration shown in FIG. 2. For example, a configuration may be adopted in which the resistance circuit 312 is provided between the node where the reference voltage VREF is input and the ground node, and the comparator 313 compares the output voltage VDIV from the resistance circuit 312 with the battery voltage VBAT.

2. Operation

Figure 3:
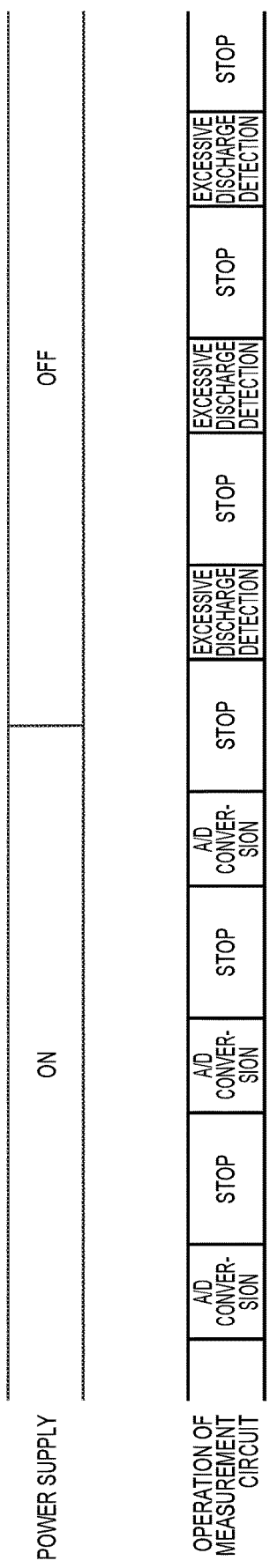
FIG. 3 is a timing chart illustrating operation of the circuit device.

FIG. 3 is a timing chart illustrating operation of the circuit device 310.

As shown in FIG. 3, when the power supply to the processing device 100 is on, the measurement circuit 370 performs an A/D conversion operation that performs A/D conversion of the battery voltage VBAT. On the other hand, when the power supply to the processing device 100 is off, the measurement circuit 370 performs excessive discharge detection of the battery 90.

According to this embodiment, it is possible to cause the measurement circuit 370 to perform only necessary operation according to the state of the power supply from the battery 90 to the processing device 100, and thus it is possible to reduce the power consumption of the measurement circuit 370. That is, during power supply, battery voltage information can be acquired to measure the remaining battery amount, and also excessive discharge detection can be performed based on the battery voltage information. On the other hand, while power supply is stopped, battery voltage information for the processing device 100 is unnecessary, so it is possible to perform only excessive discharge detection. Therefore, it is possible to realize measurement of the remaining battery amount and excessive discharge detection, and also possible to reduce the power consumption of the measurement circuit 370 by stopping measurement of the remaining battery amount when measurement of the remaining battery amount is unnecessary.

Also, in this embodiment, the measurement circuit 370 intermittently performs operation to measure the battery voltage VBAT. That is, the A/D conversion operation is intermittently performed when the power supply is on. Also, the excessive discharge detection is intermittently performed when the power supply is off. "Intermittently" means that a stoppage period, where operation of the measurement circuit 370 is stopped, is provided between operations. In the stoppage period, operations of the counter 311 and the comparator 313 are stopped, and the measurement circuit 370 does not consume electric power.

According to this embodiment, the measurement circuit 370 performs operation intermittently, so power consumption of the measurement circuit 370 can be reduced. That is, it is possible to reduce power consumption when measuring the remaining battery amount and performing excessive discharge detection. The battery voltage VBAT does not change abruptly, so it is conceivable to perform measurement of the battery voltage VBAT and excessive discharge detection at somewhat long intervals. Therefore, by intermittently performing these measurements, power consumption from the battery 90 can be reduced.

Figure 4:
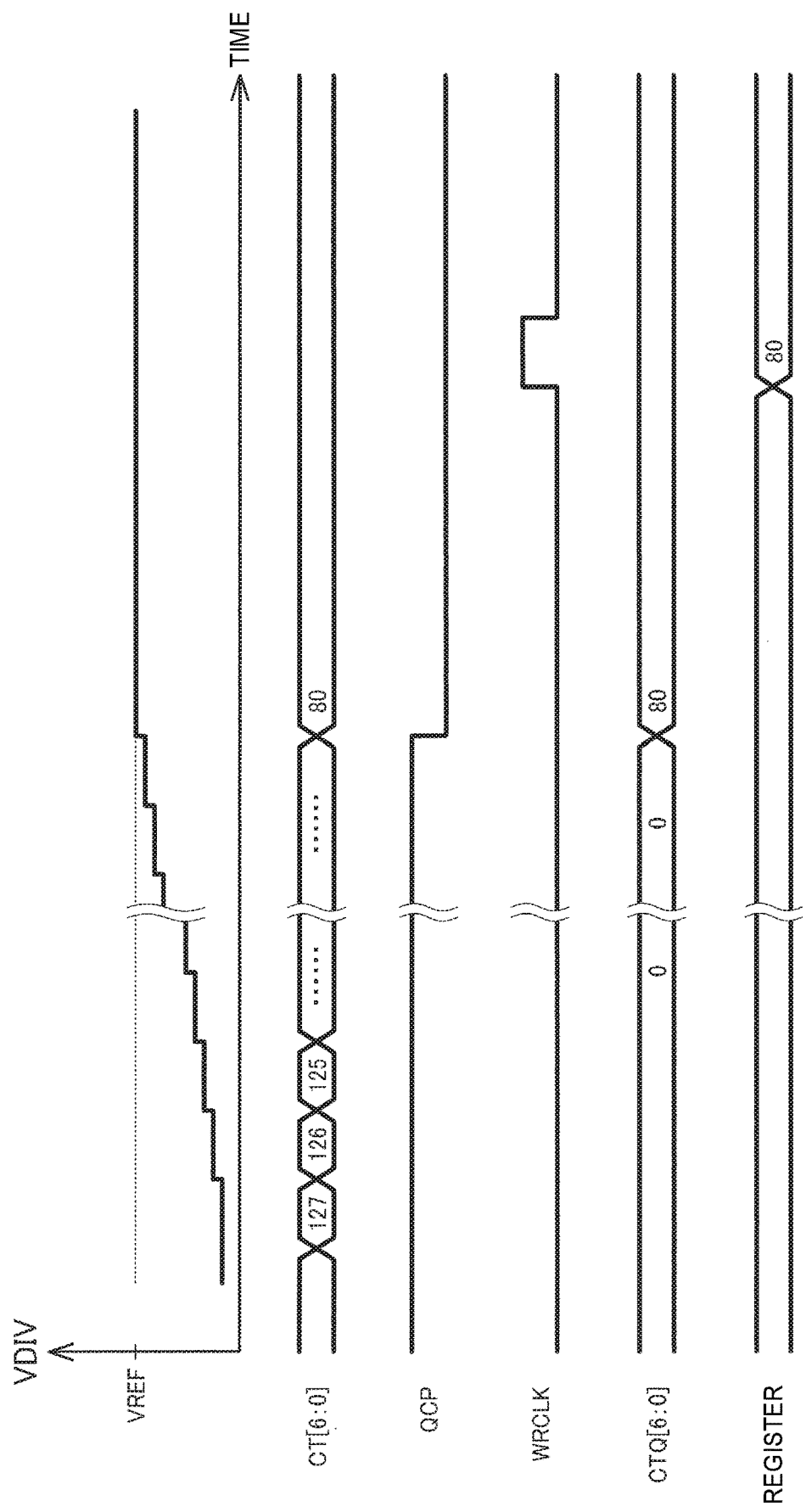

FIG. 4 is a timing chart illustrating operation of the measurement circuit 370 and the circuit device 310 when power supply to the processing device 100 is on.

The counter 311 counts down from a count value CT 6:0=127, which is the maximum value. As the count value CT 6:0 decreases, the output voltage VDIV of the resistance circuit 312 rises. When the output voltage VDIV exceeds the reference voltage VREF, the output signal QCP of the comparator 313 changes from a high level signal to a low level signal, and at that time the comparator 313 stops the counting operation. Here, it is assumed that the count value CT 6:0 at that time is 80, for example.

The counter 311 outputs data CTQ 6:0=0 to the level shifter 380 when the output signal QCP of the comparator 313 is a high level signal, and outputs data CTQ 6:0=CTQ 6:0 to the level shifter 380 when the output signal QCP of the comparator 313 is a low level signal. That is, after the counting operation of the counter 311 is stopped, the counter 311 outputs CTQ 6:0=80 to the level shifter 380. The signal level of this data CTQ 6:0 is level-shifted by the level shifter 380 and input to the register 330.

After the counter 311 stops the counting operation, the counter 311 outputs a clock signal WRCLK for register writing. The clock signal WRCLK is level-shifted by the level shifter 380 and input to the register 330. The register 330 holds the count value CT 6:0=80 at the edge of the clock signal WRCLK. The interface circuit 340 outputs the count value CT 6:0=80 stored in the register 330 to the processing device 100.

According to this embodiment, the counter 311 stops the counting operation when the signal level of the output signal QCP of the comparator 313 transitions. Also, the interface circuit 340 outputs the count value CT 6:0=80 when the counting operation was stopped as the battery voltage information.

By adopting this sort of configuration, when the power supply to the processing device 100 is on, the measurement circuit 370 can perform A/D conversion of the battery voltage VBAT. Also, count value CT 6:0=80, which is the digitally converted data resulting from that A/D conversion, can be output to the processing device 100 as the battery voltage information.

Also, in this embodiment, the level shifter 380 converts from a signal level corresponding to the power supply voltage of the measurement circuit 370 to a signal level corresponding to a power supply voltage VIF of the register 330 and the interface circuit 340. The power supply voltage VIF is supplied from outside of the circuit device 310, for example. The power supply voltage of the measurement circuit 370 is the battery voltage VBAT, or a voltage obtained by regulating the battery voltage VBAT. Also, when performing the counting operation, the counter 311 sets the input signal level of the level shifter 380 to a fixed signal level. In the example shown in FIG. 4, the signal level of the CTQ 6:0 is fixed to a low level signal.

When the input signal level of the level shifter 380 changes, a through current flows when performing switching within the level shifter 380. During the counting operation, it is not necessary to write the count value CT 6:0 to the register 330, so the input signal level of the level shifter 380 may be fixed. Therefore, the through current when performing switching of the level shifter 380 can be reduced, and power consumption from the battery 90 can be reduced. Also, when the power supply is off, the count value CT 6:0 is fixed, so the input signal level of the level shifter 380 is fixed. As described above, by changing the input signal level of the level shifter 380 only when necessary, it is possible to reduce power consumption when measuring the remaining battery amount and performing excessive discharge detection.

Figure 5:
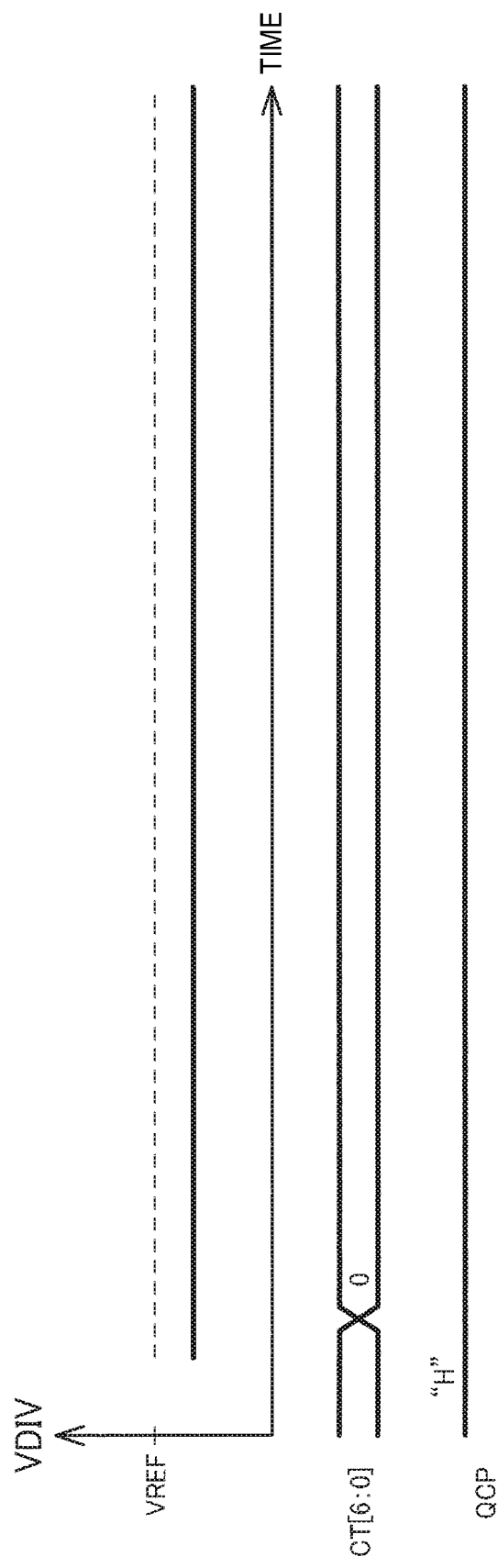
FIG. 5 is a timing chart illustrating operation of the measurement circuit and the circuit device when power supply to the processing device is off.

FIG. 5 is a timing chart illustrating operation of the measurement circuit 370 and the circuit device 310 when power supply to the processing device 100 is off.

When the power supply to the processing device 100 is off, the count value CT 6:0 is fixed to a minimum value 0. At this time, the transistors TV0 to TV6 of the variable resistance circuit 314 are all on, and the resistance value of the variable resistance circuit 314 is at its minimum value. When VDIV<VREF, the output signal QCP of the comparator 313 becomes a high level signal. This indicates that the battery voltage VBAT is lower than the excessive discharge detection voltage. The control circuit 350 judges that the battery voltage VBAT indicates excessive discharge when the output signal QCP is a high level signal. On the other hand, when VDIV>VREF, the output signal QCP of the comparator 313 becomes a low level signal, and the control circuit 350 judges that the battery voltage VBAT does not indicate excessive discharge.

According to this embodiment, when the power supply to the processing device 100 is off, the control circuit 350 determines whether or not the battery 90 is in the excessively discharged state based on the comparison result of the comparator 313. On the other hand, when the power supply to the processing device 100 is on, the control circuit 350 determines whether or not the battery 90 is in the excessively discharged state based on the count value when the counter 311 stopped the counting operation. That is, the control circuit 350 compares the count value CT 6:0 when the counting operation was stopped with the count value "0" corresponding to the excessive discharge detection voltage, and determines that the battery 90 is in the excessively discharged state when the count value CT 6:0 when the counting operation was stopped is "0".

By adopting this sort of configuration, when measurement of the battery voltage VBAT is necessary, the control circuit 350 can judge excessive discharge using the information of the measured battery voltage VBAT, and when measurement of the battery voltage VBAT is unnecessary, the measurement circuit 370 can judge excessive discharge based on the result of excessive discharge detection performed by the measurement circuit 370. By adopting such minimum necessary operation, it is possible to reduce power consumption of the measurement circuit 370, the control circuit 350, and the like.

Level Shifter and Counter

Figure 6:
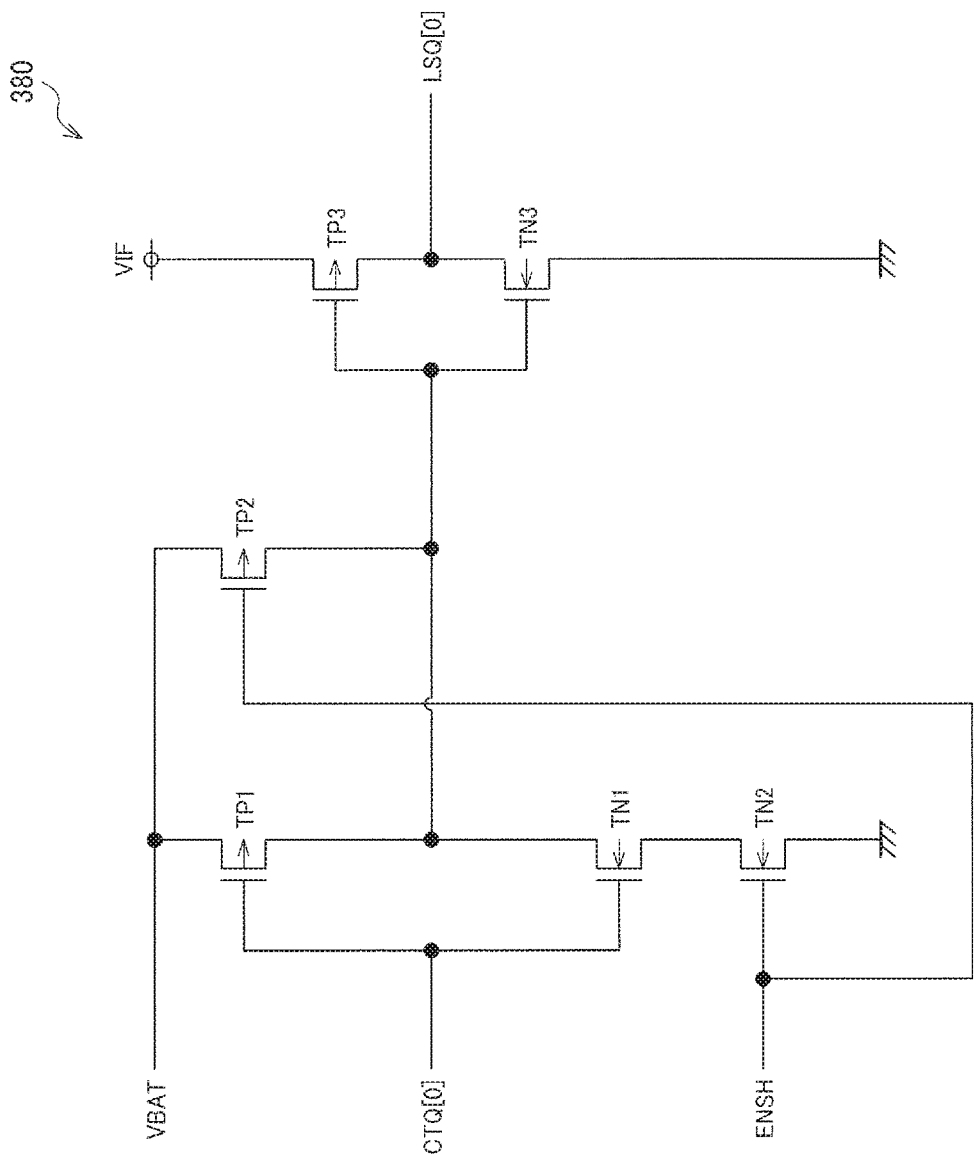
FIG. 6 shows a detailed configuration example of a level shifter.

FIG. 6 shows a detailed configuration example of the level shifter 380. By way of example, FIG. 6 shows a level shifter that performs level-shifting of a bit signal CTQ 0 of the data CTQ 6:0, but a level shifter that performs level-shifting of bit signals CTQ 1 to CTQ 6 has a similar configuration.

The level shifter 380 includes transistors TP1 to TP3 and TN1 to TN3. The transistors TP1 to TP3 are P-type MOS transistors, and the transistors TN 1 to TN 3 are N-type MOS transistors. The transistors TP1 and TN1 constitute a first inverter that operate with the battery voltage VBAT, and logically invert the bit signal CTQ 0. The transistors TP3 and TN3 constitute a second inverter that operate with the power supply voltage VIF of the register 330, and logically invert the output signal of the first inverter, and output a logically inverted bit signal LSQ 0 to the register 330. As described above, the signal level in the battery voltage VBAT is shifted to the signal level in the power supply voltage VIF.

An enable signal ENSH is input to the gates of the transistors TN2 and TP2 from the control circuit 350. The enable signal ENSH is set to a low level signal in the shutdown state, in which the discharge path from the battery 90 is cut off. For example, when excessive discharge is detected, the control circuit 350 sets the shutdown state. When the enable signal ENSH is a low level signal, the transistor TN2 is off and the transistor TP2 is on. Also, in the shutdown state, the counter 311 outputs CTQ 6:0=0. Therefore, the transistors TN1 and TN2, which are connected in series, are switched off, and leakage current from the battery 90 to the ground node is reduced. Therefore, discharging of the battery 90 in the shutdown state can be reduced as much as possible.

Figure 7:
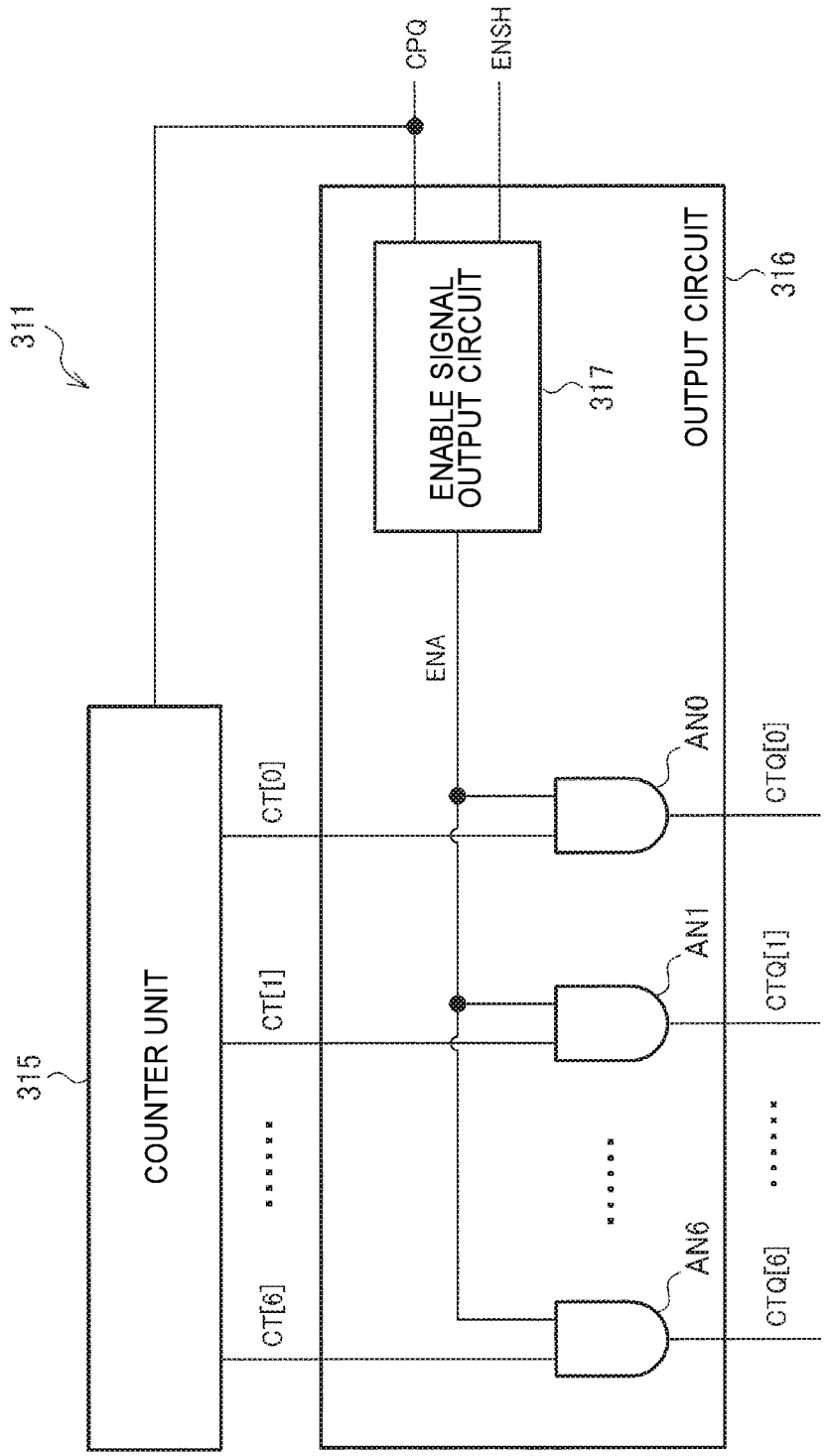
FIG. 7 shows a detailed configuration example of a counter.

FIG. 7 shows a detailed configuration example of the counter 311. The counter 311 includes a counter unit 315 and an output circuit 316.

The counter unit 315 performs the counting operation and outputs the count value CT 6:0. When the output signal QCP of the comparator 313 is a low level signal, the counter unit 315 stops the counting operation. When the power supply to the processing device 100 is off, the counter unit 315 sets a fixed value of the count value CT 6:0 based on control from the control circuit 350.

The output circuit 316 includes an enable signal output circuit 317 and AND circuits AN0 to AN6.

The enable signal output circuit 317 activates an enable signal ENA for outputting the counter value when the output signal QCP of the comparator 313 is a low level signal and the enable signal ENSH related to shutdown is a high level signal. Otherwise, the enable signal output circuit 317 deactivates the enable signal ENA. In the example shown in FIG. 7, active is a high level signal and inactive is a low level signal.

When the enable signal ENA is a high level signal, the AND circuits AN0 to AN6 output the count value CT 6:0 as the data CTQ 6:0 to the level shifter 380. On the other hand, when the enable signal ENA is a low level signal, the AND circuits AN0 to AN6 output "0" as the data CTQ 6:0. As shown in FIG. 4, when the counter 311 is performing the counting operation, the output signal QCP of the comparator 313 is a high level signal, so the enable signal ENA is a low level signal and the input signal level at the level shifter 380 is fixed at the low level.

Figure 8:
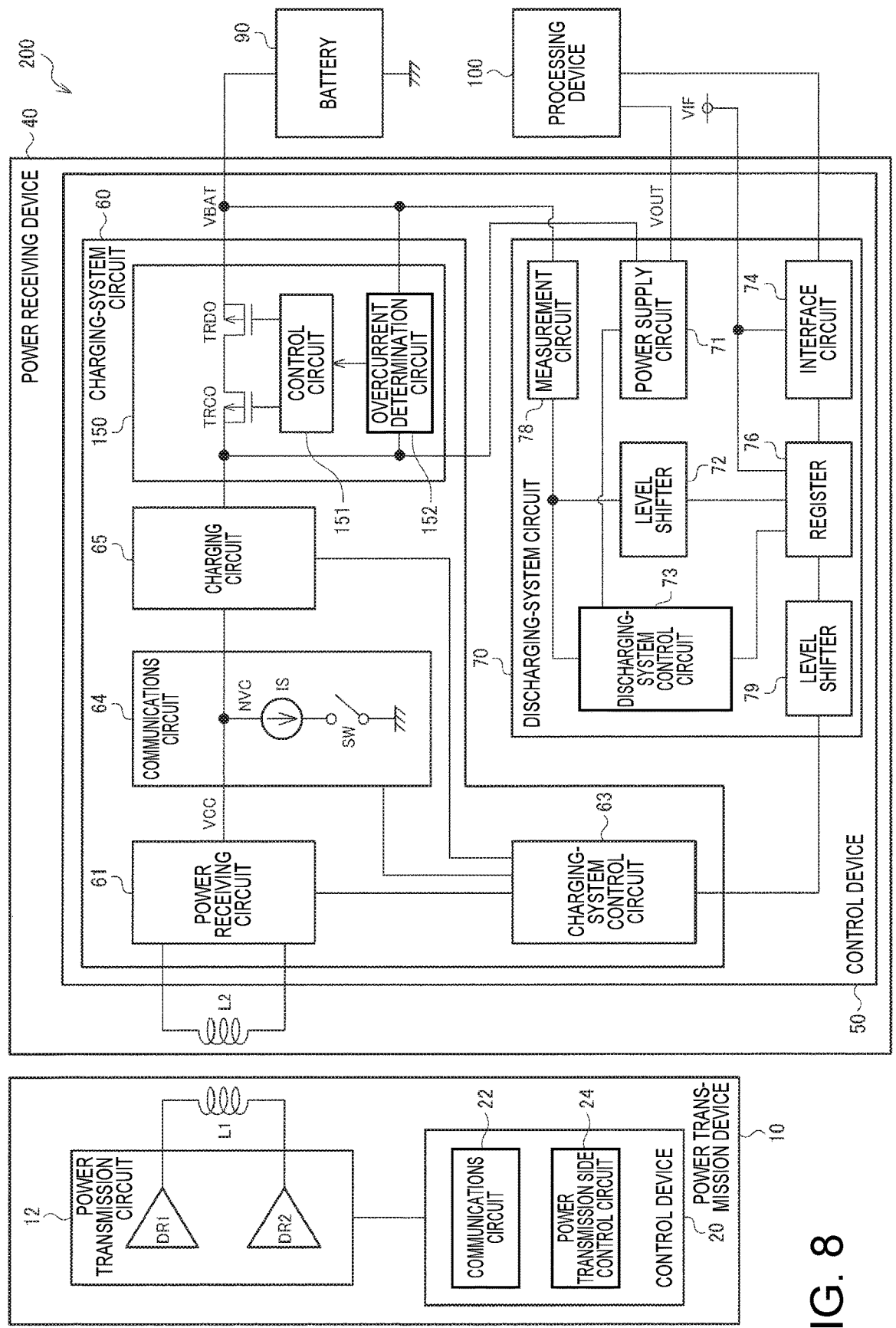
FIG. 8 shows a configuration example of a contactless power transmission system, a power receiving device, and a control device on a power receiving side.

4. Contactless Power Transmission System, Power Receiving Device, and Control Device on Power Receiving Side FIG. 8 shows a configuration example of a contactless power transmission system 200, the power receiving device 40, and the control device 50 on the power receiving side. Also, FIG. 8 shows a configuration example of the power transmission device 10 and the control device 20 on the power transmission side.

Figure 9:
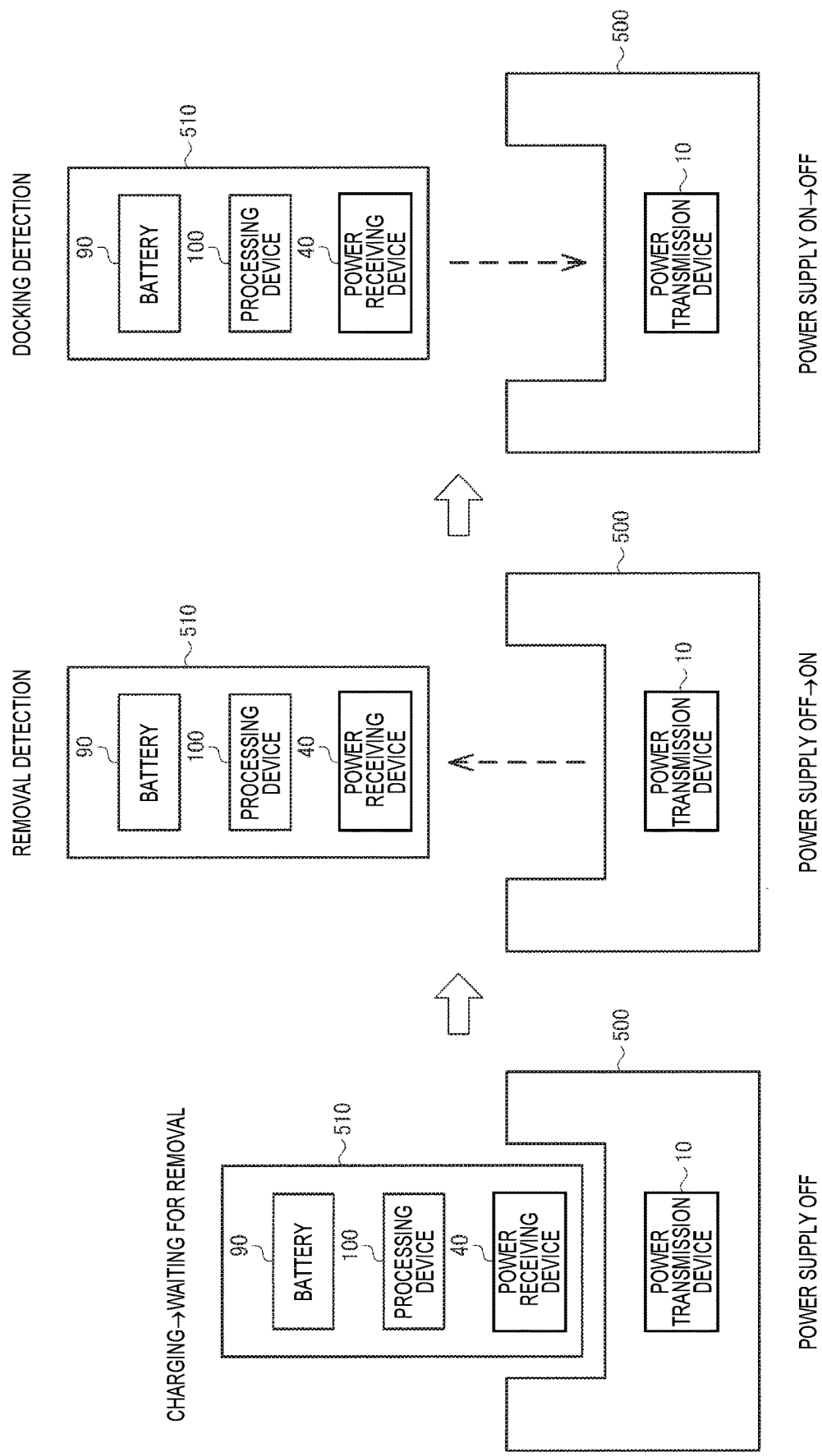
FIG. 9 shows a configuration example of an electronic device on a power transmission side and the electronic device on the power receiving side, and illustrates operation of those electronic devices.

The electronic device on the power transmission side in the contactless power transmission system is, for example, the charger 500 in FIG. 9. The electronic transmission device on the power transmission side includes the power transmission device 10. The electronic device on the power receiving side in the contactless power transmission system is, for example, the electronic device 510 in FIG. 9. The electronic device on the power receiving side can include the power receiving device 40, the battery 90, and a processing device 100. Note that the battery 90 is subject to charging in a broad sense. The power transmission device 10 and the power receiving device 40 constitute the contactless power transmission system 200 of this embodiment.

As the electronic device of the power receiving side, various electronic devices can be assumed, such as a hearing aid, a wrist watch, a biological information measuring device, a portable information terminal, a cordless telephone device, a shaver, an electric toothbrush, a wrist computer, a hand-held terminal, an electric automobile, or an electric bicycle. A biological information measuring device can be assumed to be a wearable device to be used worn on a human body. Also, the portable information terminal is, for example, a smartphone, a mobile telephone, a head-mounted display, or the like.

The power transmission device 10 includes a primary coil L1, a power transmission circuit 12, and the control device 20. The power transmission device 10 is also referred to as a primary side device or a primary side module. The control device 20 is, for example, an integrated circuit device.

The power transmission circuit 12 generates an alternating current voltage of a predetermined frequency during power transmission and supplies this to the primary coil L1. The power transmission circuit 12 includes a power transmission driver DR1 that drives one end of the primary coil L1 and a power transmission driver DR2 that drives the other end of the primary coil L1. Each of the power transmission drivers DR1 and DR2 is a buffer circuit constituted by, for example, a power MOS transistor. Power is transmitted from the primary coil L1 to a secondary coil L2 by the drivers DR1 and DR2 applying alternating current voltage to the primary coil L1.

The primary coil L1 is electromagnetically coupled with the secondary coil L2 to form a power transmission transformer. For example, when power transmission is required, the electronic device on the power receiving side is placed on the charger, establishing a state such that the magnetic flux of the primary coil L1 passes through the secondary coil L2. This is referred to as the docked state, and changing from the removed state to the docked state is called docking. On the other hand, when power transmission is unnecessary, the charger and the electronic device on the power receiving side are physically separated from each other, such that the magnetic flux of the primary coil L1 does not pass through the secondary coil L2. This is called the removed state, and changing from the docked state to the removed state is called removal.

The control device 20 performs various control on the power transmission side. The control device 20 includes a communications circuit 22 and a power transmission side control circuit 24.

The communications circuit 22 performs communications processing between the power transmission device 10 and the power receiving device 40. That is, the communications circuit 22 receives communications data from the power receiving device 40 to the power transmission device 10, and sends communications data from the power transmission device 10 to the power receiving device 40. Communications data is exchanged through a power transmission path. Specifically, when the power receiving device 40 performs load modulation, the amount of current that flows through the primary coil L1 changes, and thus the current that flows to the power supply of the power transmission drivers DR1 and DR2 changes. The communications circuit 22 includes a current-voltage conversion circuit that converts the current into a voltage, and a comparator that compares that voltage with a reference voltage. The power transmission side control circuit 24 acquires communications data based on an output signal of the comparator. Also, the communications circuit 22 changes the driving frequency at which the power transmission circuit 12 drives the primary coil L1 based on the communications data. By detecting this frequency change on the power receiving side, communications data is sent from the power transmission device 10 to the power receiving device 40.

The power transmission side control circuit 24 controls various processing performed by the control device 20. That is, the power transmission side control circuit 24 controls power transmission by the power transmission circuit 12, and controls communications processing by the communications circuit 22. The power transmission side control circuit 24 is configured with a logic circuit.

The power receiving device 40 includes the secondary coil L2 and the control device 50. The power receiving device 40 is also referred to as a secondary side device or a secondary side module. The control device 50 is, for example, an integrated circuit device.

The control device 50 performs various control on the power receiving side. The control device 50 includes a charging-system circuit 60 and a discharging-system circuit 70.

The charging-system circuit 60 is a circuit operated by electric power received by a power receiving circuit 61, and operates while the power receiving circuit 61 is receiving power and during charging of the battery 90. That is, each part of the charging-system circuit 60 operates based on a rectified voltage VCC, or based on a voltage obtained by regulating the rectified voltage VCC. The charging-system circuit 60 receives electric power supplied from the power transmission device 10 and charges the battery 90 based on the received electric power. The charging-system circuit 60 includes the power receiving circuit 61, a charging-system control circuit 63, a communications circuit 64, a charging circuit 65, and a protection circuit 150.

The discharging-system circuit 70 is a circuit operated by power supplied from the battery 90, and performs power supply to the processing apparatus 100 based on electric power from the battery 90. Each part of the discharging-system circuit 70 operates based on a battery voltage VBAT. Also, in the discharging-system circuit 70, in the shutdown state, the power supply from the battery 90 is cut off and operation is stopped. The discharging-system circuit 70 includes a power supply circuit 71, a level shifter 72, a discharging-system control circuit 73, an interface circuit 74, a register 76, a measurement circuit 78, and a level shifter 79.

The power receiving circuit 61 receives electric power from the power transmission device 10. Specifically, the power receiving circuit 61 converts alternating current induced voltage of the secondary coil L2 into the direct current rectified voltage VCC. This conversion is performed by a rectifying circuit of the power receiving circuit 61. The rectifying circuit can be realized by, for example, a plurality of transistors, diodes, and the like.

The charging-system control circuit 63 controls the power receiving circuit 61, the communications circuit 64, and the charging circuit 65, and executes various control processing performed during charging of the battery 90. Also, the charging-system control circuit 63 performs receiving processing to receive communications data sent from the power transmission device 10. The power receiving circuit 61 has a comparator that converts the alternating current induced voltage of the secondary coil L2 into a rectangular wave signal. As described above, the power transmission device 10 changes the frequency of the alternating current voltage that drives the primary coil L1 based on communications data. The charging-system control circuit 63 measures the frequency of the rectangular wave signal using a counter or the like, for example, and receives communications data based on a result of that measurement. The charging-system control circuit 63 can be realized by various processors such as a logic circuit generated by an automatic placement and routing method such as a gate array, or a DSP (Digital Signal Processor), for example.

The communications circuit 64 performs load modulation for sending communications data to the power transmission device 10. Note that the communications circuit 64 is also referred to as a load modulation circuit. The communications circuit 64 has a current source IS and a switch SW. The current source IS allows a constant current to flow from a node NVC of the rectified voltage VCC to a ground node. The switch SW is configured with a transistor. The current source IS and the switch SW are provided in series between the node NVC of the rectified voltage VCC and the ground node. Based on the control signal from the charging-system control circuit 63, the switch SW is turned on or off to turn on or off the constant current that flows from the node NVC to the ground node. The control signal is a signal corresponding to communications data. The load seen from the power transmission circuit 12 differs between when the constant current is on and when the constant current is off. Communications from the power receiving device 40 to the power transmission device 10 are realized by the communications circuit 22 on the power transmission side detecting this load difference with the technique described above.

The charging circuit 65 performs charging and control of the battery 90. The charging circuit 65 charges the battery 90 based on the electric power received by the power receiving circuit 61. That is, the charging circuit 65 charges the battery 90 by generating a constant current based on the rectified voltage VCC and supplying the constant current to the terminal of the battery 90.

The power supply circuit 71 supplies power to the processing apparatus 100. That is, the power supply circuit 71 supplies power from the battery 90 to the processing apparatus 100 by performing discharging operation of the battery 90. The power supply circuit 71 converts the battery voltage VBAT to an output voltage VOUT and supplies the output voltage VOUT to the processing device 100. The power supply circuit 71 can be constituted by a charge pump circuit or the like, for example.

The discharging-system control circuit 73 executes various control processing performed during discharge of the battery 90. The discharging-system control circuit 73 controls the power supply circuit 71, the interface circuit 74, and the measurement circuit 78. For example, the discharging-system control circuit 73 performs battery protection control based on the battery voltage VBAT measured by the measurement circuit 370, or the excessive discharge detection result from the measurement circuit 370. Also, the discharging-system control circuit 73 controls power supply from the power supply circuit 71 to the processing device 100. That is, the discharging-system control circuit 73 performs control to switch between power supply on and power supply off. The discharging-system control circuit 73 can be realized by various processors such as a logic circuit generated by an automatic placement and routing method such as a gate array, or a DSP (Digital Signal Processor), for example.

The interface circuit 74 is an interface used for sending and receiving information between the processing device 100 and the control device 50. The information sent or received is, for example, data, a command, or the like. As the interface circuit 74, circuits of various interface systems can be adopted, and it is possible to adopt, for example, an interface circuit of an SPI (Serial Peripheral Interface) system or an I2C (Inter Integrated Circuit) system. Also, the interface circuit 74 may include an interrupt circuit that sends an interrupt signal to the processing device 100.

The measurement circuit 78 performs A/D conversion of the battery voltage VBAT when the power supply to the processing device 100 is on, and performs excessive discharge detection when the power supply to the processing device 100 is off.

The level shifter 72 performs level shifting from the signal level of the battery voltage VBAT, which is the power supply voltage of the measurement circuit 370, to the signal level of the power supply voltage VIF of the register 330.

The level shifter 79 performs level shifting from the signal level of the power supply voltage of the charging-system control circuit 63 to the signal level of the power supply voltage VIF of the register 330. The power supply voltage of the charging-system control circuit 63 is a voltage obtained by regulating the rectified voltage VCC.

The protection circuit 150 includes the control circuit 151, an overcurrent determination circuit 152, and transistors TRDO and TRCO.

The overcurrent determination circuit 152 determines charging overcurrent, discharging overcurrent, and a short circuit of the battery 90 based on the voltage of the output node of the charging circuit 65 and the battery voltage VBAT. The specific operation is similar to the overcurrent determination circuit 360 in FIG. 1.

The control circuit 151 switches on the transistors TRDO and TRCO when charging and discharging the battery 90. Also, when the discharging-system control circuit 73 detects excessive discharge based on the measurement result of the measurement circuit 78, the discharging-system control circuit 73 outputs a detection signal giving notification of this information to the control circuit 151. When the above-mentioned detection signal is received, the control circuit 151 shuts down discharging from the battery 90. Also, when the overcurrent determination circuit 152 detects charging overcurrent, the control circuit 151 stops charging of the battery 90. Also, when the overcurrent determination circuit 152 detects discharging overcurrent, the control circuit 151 shuts down discharging from the battery 90. Also, when the overcurrent determination circuit 152 detects a short circuit of the battery 90, the control circuit 151 stops charging of the battery 90.

FIG. 9 shows a configuration example of an electronic device on the power transmission side and an electronic device on the power receiving side, and illustrates operation of those electronic devices.

The charger 500 is an electronic device on the power transmission side. The charger 500 includes the power transmission device 10 that transmits power to the electronic device 510 on the power receiving side by contactless power transmission. The electronic device 510 on the power receiving side includes the battery 90, the power receiving device 40, and the processing device 100. The power receiving device 40 receives electric power transmitted from the power transmission device 10, and charges the battery 90 with that electric power. Also, the power receiving device 40 controls power supply from the battery 90 to the processing device 100.

In a docked state where the electronic device 510 has been placed on the charger 500, power is transmitted from the power transmission device 10 to the power receiving device 40, and the power receiving device 40 charges the battery 90 with that power. In this state, the power receiving device 40 turns off power supply to the processing device 100. When the battery 90 becomes fully charged, the power transmission device 10 and the power receiving device 40 are put in a state waiting for removal. In the state waiting for removal, the power transmission device 10 performs intermittent power transmission. The power receiving device 40 holds the rectified voltage VCC with a capacitor, and detects a change to the removed state when the held voltage has dropped below a threshold voltage for detecting removal.

The power receiving device 40 causes the power supply to the processing device 100 to transition from off to on when removal is detected. Thus, the processing device 100 operates and the electronic device 510 becomes usable, for example.

After removal, the power receiving device 40 and the power transmission device 10 enter a docking detection state. In the docking detection state, the power transmission device 10 performs intermittent power transmission. The power receiving device 40 monitors the rectified voltage VCC, and detects a change to the docked state when the rectified voltage VCC has risen above a threshold voltage for detecting docking.

The power receiving device 40 causes the power supply to the processing device 100 to transition from on to off when docking is detected. Also, the power receiving device 40 performs load modulation, and when the power transmission device 10 detects that the load receiving device 40 has performed load modulation, the power transmission device 10 switches from intermittent power transmission to continuous power transmission. Also, authentication processing is performed between the power receiving device 40 and the power transmission device 10, and when the power receiving device 40 has been authenticated, the power receiving device 40 starts charging the battery 90.

In this way, switching between on and off of the power supply to the processing device 100 is performed. This control is performed by the charging-system control circuit 63 and the discharging-system control circuit 73, and the discharging-system control circuit 73 switches operation of the measurement circuit 370 according to whether the power supply is on or off.

In this embodiment, the measurement circuit 78 corresponds to the measurement circuit 370 in FIG. 1, the power supply circuit 71 corresponds to the power supply circuit device 320 in FIG. 1, the level shifter 72 corresponds to the level shifter 380 in FIG. 1, the register 76 corresponds to the register 330 in FIG. 1, and the interface circuit 74 corresponds to the interface circuit 340 in FIG. 1. Also, the discharging-system control circuit 73, the charging-system control circuit 63, and the charging circuit 65 correspond to the control circuit 350 and the transistors TRDO and TRCO in FIG. 1. Also, the rectified voltage VCC corresponds to the voltage VCCIN in FIG. 1.

According to this embodiment, the measurement circuit 78 measures the battery voltage VBAT. The interface circuit 74 outputs the battery voltage information, which is information regarding the battery voltage VBAT measured by the measurement circuit 78, to the processing device 100. The discharging-system control circuit 73 performs battery protection control processing. Similar to the measurement circuit 370 shown in FIG. 2, the measurement circuit 78 includes the counter 311, the resistance circuit 312, and the comparator 313. When the power supply from the battery 90 to the processing device 100 is off, the counter 311 sets the count value to a fixed value. Also, the discharging-system control circuit 73 performs battery protection control processing based on the comparison result of the comparator 313.

Also, when the power supply to the processing device 100 is off, the discharging-system control circuit 73 determines whether or not the battery 90 is in the excessively discharged state based on the comparison result of the comparator 313. On the other hand, when the power supply to the processing device 100 is on, the discharging-system control circuit 73 determines whether or not the battery 90 is in the excessively discharged state based on the count value CT 6:0 when the counter 311 stopped the counting operation.

As described above, the invention is applicable to the control device 50 on the power receiving side of the contactless power transmission system 200. Contactless power transmission is used in various electronic devices, and is used in small devices such as wireless earphones and hearing aids, for example. In small devices, battery capacity is small so it is desirable that the battery has low power consumption, and according to this embodiment, measurement of the battery voltage VBAT and excessive discharge detection can be performed with low power consumption.

Note that although this embodiment has been described in detail above, it will be easily understood by those skilled in the art that many modifications that do not substantially deviate from novel matters and effects of the invention are possible. Accordingly, all such modifications are encompassed by the invention. For example, in the specification or the drawings, a term described at least once together with a different term having a broader or equivalent meaning can be replaced with the different term at any point in the specification or the drawings. Also, all combinations of this embodiment and modifications are encompassed by the invention. Also, the configuration, operation, and the like of the circuit device, the control device on the power receiving side, the power receiving device, the control device on the power transmission side, the power transmission device, the contactless power transmission system, and the electronic device are not limited to those described in this embodiment, and various modified embodiments are possible.

What is claimed is:

1. A circuit device, comprising:
a measurement circuit that measures a battery voltage;
an interface circuit that outputs, to a processing device, battery voltage information that is information regarding the battery voltage measured by the measurement circuit; and
a control circuit that performs battery protection control processing;
the measurement circuit having:
a counter;
a resistance circuit provided between a node where the battery voltage is input and a ground node, with a voltage division ratio set by a count value of the counter, and the resistance circuit outputting an output voltage obtained by dividing the battery voltage by the voltage division ratio; and
a comparator that compares the output voltage from the resistance circuit with a reference voltage,
wherein when a power supply from a battery to the processing device is off, the counter sets the count value to a fixed value, and the control circuit performs the battery protection control processing based on a comparison result of the comparator, and
the resistance circuit having:
a variable resistance circuit where the battery voltage is input to one end, and a resistance value is set by the count value; and
a first resistor and a second resistor connected in series between the other end of the variable resistance circuit and a ground node,
wherein a voltage of a node between the first resistor and the second resistor is output to the comparator as the output voltage.

2. The circuit device according to claim 1,
wherein the fixed value is a count value corresponding to an excessive discharge detection voltage for detecting excessive discharge of the battery.

3. An electronic device, comprising:
the circuit device according to claim 2.

4. The circuit device according to claim 1,
wherein when the power supply from the battery to the processing device is on, the counter stops a counting operation when a signal level of an output signal of the comparator transitions, and the interface circuit outputs the count value when the counting operation was stopped as the battery voltage information.

5. The circuit device according to claim 4,
wherein the control circuit, when the power supply from the battery to the processing device is off, determines whether or not the battery is in an excessively discharged state based on a comparison result of the comparator, and
when the power supply from the battery to the processing device is on, determines whether or not the battery is in the excessively discharged state based on the count value when the counting operation was stopped.

6. An electronic device, comprising:
the circuit device according to claim 5.

7. The circuit device according to claim 4, comprising:
a register that stores the battery voltage information; and
a level shifter that performs conversion from a signal level corresponding to a power supply voltage of the measurement circuit to a signal level corresponding to a power supply voltage of the register and the interface circuit;
wherein the counter, when performing the counting operation, sets an input signal level of the level shifter to a fixed signal level, the measurement circuit, when the counter has stopped the counting operation, writes the battery voltage information to the register through the level shifter, and the interface circuit outputs the battery voltage information written to the register to the processing device.

8. An electronic device, comprising:

the circuit device according to claim 7.

9. An electronic device, comprising:

the circuit device according to claim 4.

10. The circuit device according to claim 1, wherein the measurement circuit intermittently performs an operation that measures the battery voltage.

11. An electronic device, comprising:

the circuit device according to claim 10.

12. An electronic device, comprising:

the circuit device according to claim 1.

* * * * *